United States Patent
Kao et al.

(10) Patent No.: US 7,049,163 B1
(45) Date of Patent: May 23, 2006

(54) MANUFACTURE METHOD OF PIXEL STRUCTURE

(75) Inventors: Chin-Tzu Kao, Changhua County (TW); Ta-Jung Su, Changhua County (TW); Fu-Liang Lin, Taipei (TW)

(73) Assignee: Chunghwa Picture Tubes, LTD., Taipei (TW)

( * ) Notice: Subject to any disclaimer, the term of this patent is extended or adjusted under 35 U.S.C. 154(b) by 0 days.

(21) Appl. No.: 10/907,003

(22) Filed: Mar. 16, 2005

(51) Int. Cl.
*H01L 21/28* (2006.01)

(52) U.S. Cl. .................... 438/30; 438/34; 257/E21.414

(58) Field of Classification Search ................. 438/30, 438/34, 200; 257/E21.414
See application file for complete search history.

(56) References Cited

U.S. PATENT DOCUMENTS

| | | | |
|---|---|---|---|
| 5,466,618 A * | 11/1995 | Kim | 438/30 |
| 5,478,766 A * | 12/1995 | Park et al. | 438/158 |
| 5,811,318 A * | 9/1998 | Kweon | 438/30 |
| 5,852,481 A * | 12/1998 | Hwang | 349/43 |
| 6,338,989 B1 * | 1/2002 | Ahn et al. | 438/158 |
| 6,406,949 B1 * | 6/2002 | Kim | 438/159 |
| 2002/0048834 A1 * | 4/2002 | French et al. | 438/30 |
| 2002/0052058 A1 * | 5/2002 | Tseng | 438/30 |
| 2002/0106825 A1 * | 8/2002 | Lee et al. | 438/30 |
| 2002/0168789 A1 * | 11/2002 | Wong | 438/30 |
| 2003/0219920 A1 * | 11/2003 | Baek et al. | 438/30 |
| 2005/0019970 A1 * | 1/2005 | Lai | 438/30 |

FOREIGN PATENT DOCUMENTS

EP   1380880 A1 * 1/2004

\* cited by examiner

*Primary Examiner*—George Fourson
(74) *Attorney, Agent, or Firm*—Jiang Chyun IP Office

(57) ABSTRACT

A manufacture method of a pixel structure is provided. A gate is formed over a substrate, and a gate insulator layer is formed over the substrate covering the gate. A semiconductor layer is formed over the gate insulator layer and a metal layer is formed over the semiconductor layer. A first mask layer is formed on the metal layer, and the metal layer is patterned to form a source/drain by using the first mask layer as etching mask. Afterward, a second mask layer is formed on the first mask layer and further covers a region between the source/drain. The semiconductor layer is patterned by using the first and second mask layers as etching mask, and then the first and second mask layers are removed. A passivation layer is formed over the substrate. A pixel electrode is formed on the passivation layer. The pixel electrode is electrically connected with the drain.

18 Claims, 6 Drawing Sheets

MANUFACTURE METHOD OF PIXEL STRUCTURE

BACKGROUND OF THE INVENTION

1. Field of Invention

The present invention relates to a manufacture method for a structure of semiconductor device. More particularly, the present invention relates to a manufacture method for a pixel structure of a thin-film transistor (TFT) liquid crystal display (LCD).

2. Description of Related Art

As a fact of rapid improvement in the multi-media society, it mainly is due to the benefits of great development on the semiconductor devices or the displaying device. With respect to the displaying device, the TFT-LCD with great properties of high image quality, high efficiency of space use, low power consumption and radiation has gradually become a main trend in the market.

The TFT-LCD is mainly composed of a TFT-array substrate, a color-filter-array substrate, and liquid crystal layer, wherein the TFT-array includes multiple TFT's arranged in an array manner, and pixel electrodes respectively implemented with TFT, so as to form multiple pixel structures. According to the foregoing TFT, the TFT includes a gate electrode, a channel layer, source/drain electrodes to serve as a switching device for the liquid crystal displaying unit.

FIGS. 1A–1E are cross-sectional views, schematically illustrating the conventional manufacture process flow for a pixel structure. In FIG. 1A, a gate electrode 110 is formed on a substrate 100. Then, a gate insulating layer 120 is formed on a substrate 100, and covers over the gate electrode 110. A semiconductor layer 130 is formed on the gate insulating layer 120. The semiconductor layer 130 includes a channel material layer 132 and an ohm contact material layer 134. Then, a metal layer 140 is formed on the semiconductor layer 130. Also and, a photoresist layer 150a is formed on the metal layer 140.

In FIG. 1B, the photoresist layer 150a is used as the etching mask to pattern the metal layer 140 (see FIG. 1A) to form a source electrode 142/drain electrode 144. In addition, the ohm contact material layer 134 (see FIG. 1A) is patterned to form an ohm contact layer 134a.

In FIG. 1C, the photoresist layer 150a (see FIG. 1B) is removed, and another photoresist layer 150b is formed on the source electrode 142/drain electrode 144. The photoresist layer 150b further covers the region between the source electrode 142/drain electrode 144. Here, since the photomask, used to form the photoresist layer 150b, is the photomask used in a conventional 5-step manufacture process, the photoresist layer 150b being defined has the channel island or channel peninsula pattern without fully covering the drain electrode 144.

After then, the photoresist layer 150b and the source electrode 142/drain electrode 144 thereunder are used as the etching mask to pattern the channel material layer 132 (see FIG. 1B) for forming a channel layer 132a. Wherein, since the photoresist layer 150b does not cover the drain electrode 144, a portion of the drain region 144 without being covered by the photoresist layer 150b is also bombard by the plasma during the etching process.

In FIG. 1D, the photoresist layer 150b (see FIG. 1C) is removed and a passivation layer 160 is formed over the substrate 100. In addition, an opening 162 is formed in the passivation layer 160 to expose the drain electrode 144.

In FIG. 1E, a pixel electrode 170 is formed on the passivation layer 160, and the pixel electrode 170 is electrically coupled to drain electrode 144 through the opening 162 (see FIG. 1D).

In the foregoing descriptions about the conventional method, the photoresist layer 150b does not fully cover the drain electrode 144. In this manner, when the channel material layer 132 is patterned, a portion of the drain electrode 144 is also bombarded by the plasma, causing an increase of contact impedance between the pixel electrode 170 and the drain electrode 144 at the portion being bombarded by the plasma. This may also cause the poor performance for the TFT displaying device.

SUMMARY OF THE INVENTION

The invention provides a manufacture method of pixel structure to improve the conventional method about the issue of increase of contact impedance between the pixel electrode and the drain electrode due to being bombarded by the plasma.

The invention provides a manufacture method of a pixel structure, including the following steps. A gate electrode is formed over a substrate, and a gate insulator layer is formed over the substrate covering the gate electrode. A semiconductor layer is formed over the gate insulator layer and a metal layer is formed over the semiconductor layer. A first mask layer is formed on the metal layer, and the metal layer is patterned to form a source/drain by using the first mask layer as etching mask, wherein a portion of thickness of the semiconductor layer is removed also. Afterward, a second mask layer is formed on the first mask layer and further covers a region between the source/drain electrodes. The semiconductor layer is patterned by using the first and second mask layers as etching mask, and then the first and second mask layers are removed. A passivation layer is formed over the substrate. A pixel electrode is formed on the passivation layer. The pixel electrode is electrically connected with the drain electrode.

In the foregoing manufacture method of the pixel structure, the method to form the second mask includes, for example, coating a second photoresist layer on the first mask layer, performing a photolithographic process to pattern the second photoresist layer, wherein the patterned second photoresist layer covers a portion of the first mask layer and covers the region between the source/drain electrodes.

The invention provides another manufacture method of pixel structure, including the following stapes. A gate electrode is formed over a substrate, and a gate insulator layer is formed over the substrate covering the gate electrode. A semiconductor layer is formed over the gate insulator layer and a metal layer is formed over the semiconductor layer. A first mask layer is formed on the metal layer, and the metal layer is patterned to form source/drain electrodes by using the first mask layer as etching mask, wherein a portion of thickness of the semiconductor layer is removed also. Afterward, the first mask layer is removed, and a second mask layer is formed over the source/drain electrodes and further covers a region between the source/drain electrodes. The semiconductor layer is patterned by using the second mask layer as the etching mask, and then the second mask layer is removed. A passivation layer is formed over the substrate. A pixel electrode is formed on the passivation layer. The pixel electrode is electrically connected with the drain electrode.

In the foregoing manufacture method of the pixel structure, the method to form the second mask includes, for example, coating a second photoresist layer on the source/ drain electrodes, performing a photolithographic process to pattern the second photoresist layer, wherein the patterned second photoresist layer covers the source/drain electrodes and covers the region between the source/drain electrodes.

In the foregoing manufacture method of pixel structure, the method to form the semiconductor layer includes, for example, forming a channel material layer over the gate insulating layer, and forming an ohm contact material layer over the channel material layer. In addition, after forming the source/drain electrodes, for example, the ohm contact material layer is further patterned.

In the foregoing two manufacture methods of pixel structure, after forming the passivation layer over the substrate, an opening is further formed in the passivation layer, to expose the drain electrode, and pixel electrode is electrically coupled to the drain electrode through the opening.

In the foregoing two manufacture methods of pixel structure, the method to form the first mask layer includes coating a first photoresist over the metal layer, and performing a photolithographic process to form a patterned first photoresist layer.

In the foregoing two manufacture methods of pixel structure, the method to pattern the metal layer into the source/drain electrodes includes, for example, dry etching or wet etching. In addition, the method to pattern the semiconductor layer includes, for example, dry etching.

In the foregoing two manufacture methods of pixel structure, the method to form the pixel electrode includes, for example, forming a transparent conductive film over the passivation layer, and performing a photolithographic process to pattern the transparent conductive film. Wherein, the method to form the transparent conductive film is, for example, a sputtering process.

In the manufacture method of pixel structure of the invention, while the dry etching is performed to pattern the semiconductor layer, since the first mask layer and the second mask layer are both serving as the etching mask, the drain electrode is not bombard by the plasma. As a result, the contact impedance between the drain electrode and the pixel electrode can be reduced, so that the yield can increase, and the displaying quality of the TFT-LCD can be improved. In addition, the first mask layer and the second mask layer can be simultaneously removed in the manufacture method of pixel structure of the invention. Thus, the invention can save one step of removing the mask layer, so that the throughput is improved.

Further still, in another manufacture method of pixel structure of the invention, the second mask over the source/drain electrodes is fully covering the source/drain electrodes and the region between the source/drain electrodes. Whereby, the drain electrode is bombard by the plasma while patterning the semiconductor layer by dry etching. As a result, the contact impedance between the drain electrode and the pixel electrode can be reduced, so that the yield can increase, and the displaying quality of the TFT-LCD can be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

First Embodiment

Figure 1A:
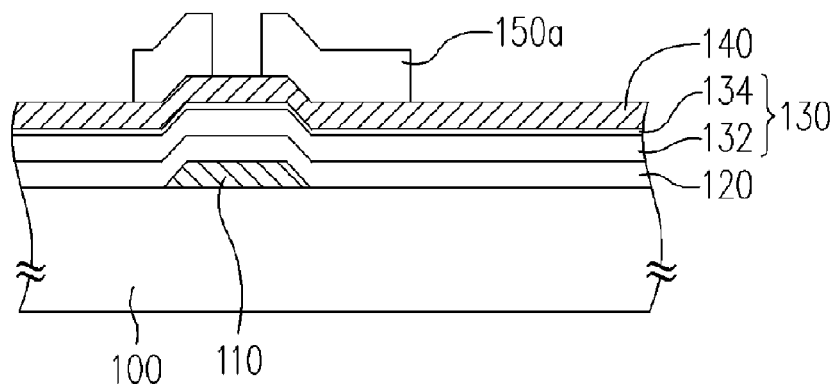
FIGS. 1A–1E are cross-sectional views, schematically illustrating the conventional manufacture process flow for a pixel structure.
Figure 1B:
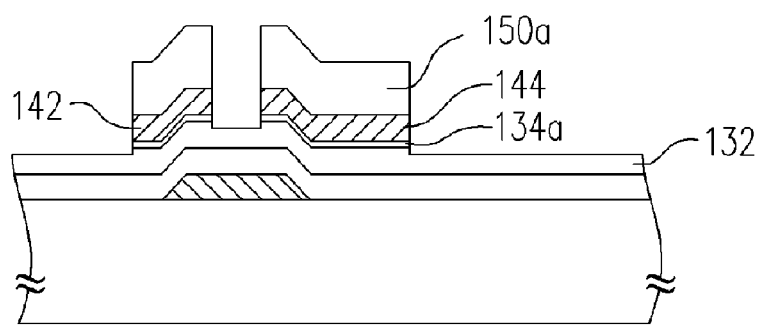
Figure 1C:
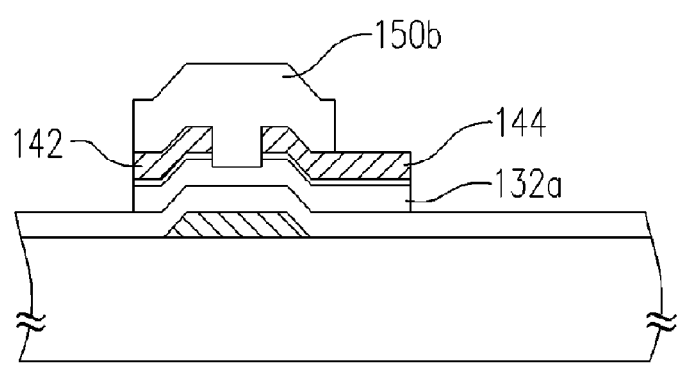
Figure 1D:
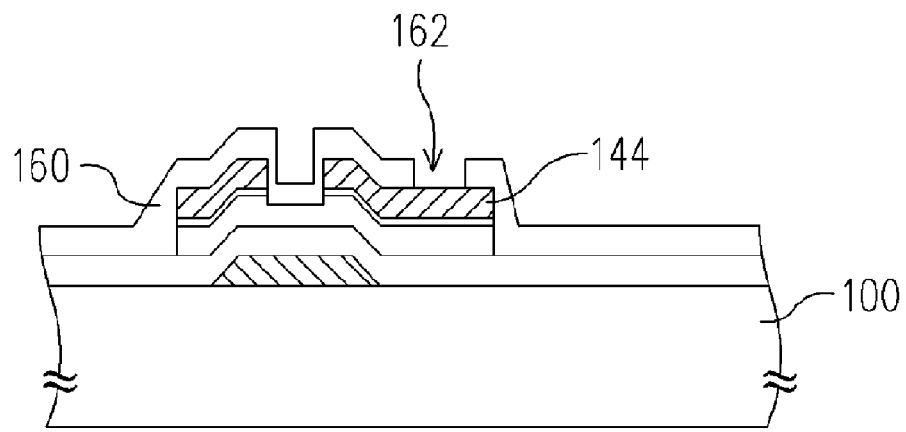
Figure 1E:
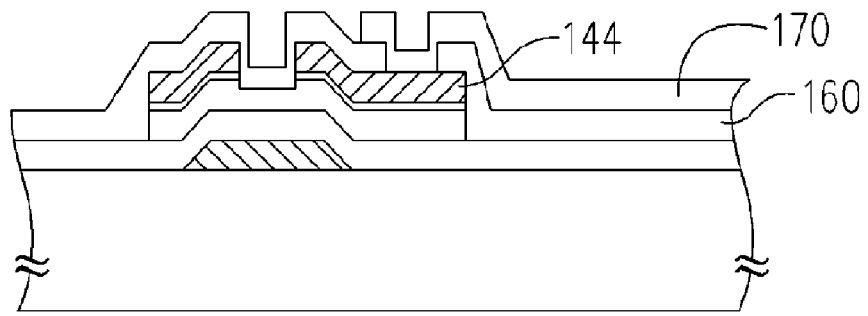
Figure 2A:
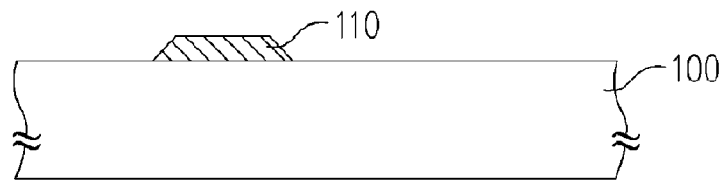
FIGS. 2A–2G are cross-sectional views, schematically illustrating the manufacture process flow for a pixel structure, according to a first embodiment of the invention.

FIGS. 2A–2G are cross-sectional views, schematically illustrating the manufacture process flow for a pixel structure, according to a first embodiment of the invention. In FIG. 2A, a gate electrode 110 is formed over a substrate 100. Wherein, the material of the gate electrode 110 includes, for example, Cr, Al, Mo or other suitable metallic material.

Figure 2B:
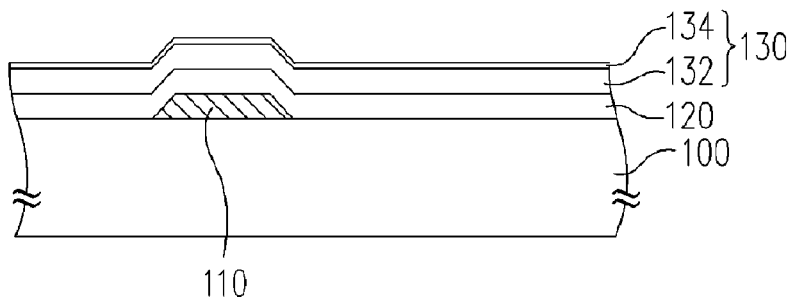

In FIG. 2B, a gate insulating layer 120 is formed over the substrate 100, and covers the gate electrode 110. After then, a semiconductor layer 130 is formed over the gate insulating layer 120. Wherein, the method for forming the semiconductor 130 includes, for example, forming a channel material layer 132 over the gate insulating layer 132. In addition, the gate insulating layer 120 includes, for example, silicon nitride. The channel material layer 132 includes, for example, amorphous silicon. The ohm contact material layer 134 includes, for example, n-type amorphous silicon. It should be noted that the ohm contact material layer 134 can be omitted, that is, the semiconductor layer 130 only includes the channel material layer 132.

Figure 2C:
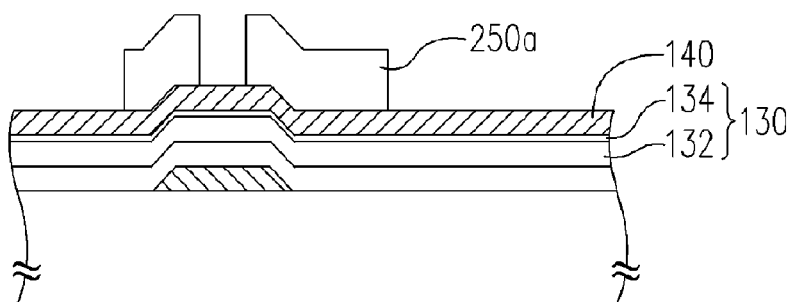

Then, in FIG. 2C, a metal layer 140 is formed over the semiconductor layer 130, and a mask layer 250a is formed over the metal layer 140. In the embodiment, the metal layer 140 is, for example, formed over the ohm contact material layer 134, and the metal layer 140 includes, for example, Cr, Al, Mo or other suitable metallic material. In addition, the method to form the mask layer 250a includes, for example, coating a photoresist layer (not shown) over the metal layer 140, and performing a photolithographic process to pattern the photoresist layer. Wherein, the method for coating the photoresist layer includes, for example, a spin coating process.

Figure 2D:
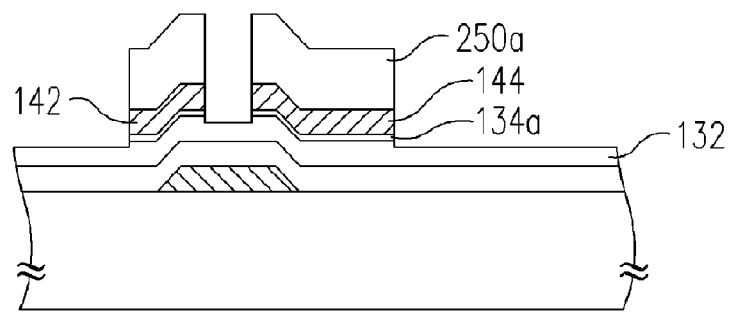

In FIG. 2D, the mask layer 250a is used as the etching mask, so as to pattern the metal layer 140 (see FIG. 2C) to form a source electrode 142 and a drain electrode 144. Wherein, the method for patterning the metal layer 140 includes, for example, the dry etching or wet etching. In more detail, in the embodiment, a plasma etching is performed on the metal layer 140 or using the etchant liquid to etch the metal layer 140, so as to form the source electrode 142/drain electrode 144. In addition, in the embodiment, after forming the source electrode 142/drain electrode 144, for example, it further includes patterning the ohm contact material layer 134 (see FIG. 2C), so as to form an ohm contact layer 134a. The process to form the ohm contact material layer 134 include, for example, a dry etching.

Figure 2E:
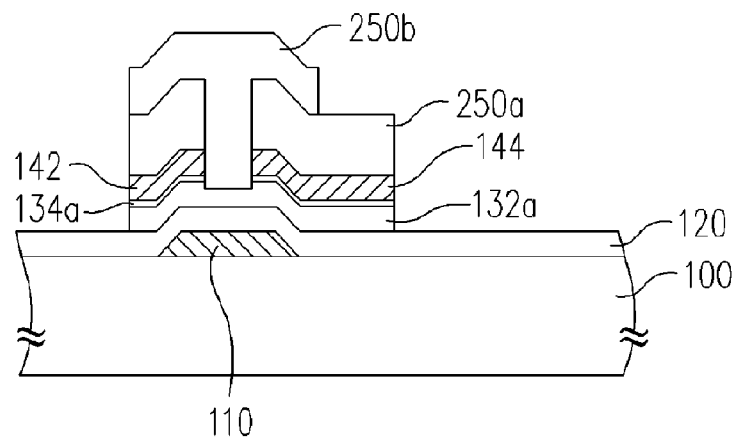

Then, in FIG. 2E, another mask layer 250b id formed over the mask layer 250a, and the mask layer 250b further covers the region between the source electrode 142 and the drain electrode 144. Wherein, the method for forming the mask layer 250b includes, for example, coating a photoresist layer (not shown) over the mask layer 250a, and performing a photolithographic process to pattern the photoresist layer.

The method for coating the photoresist layer includes, for example, a spin coating process.

The mask layers 250a, 250b are used as the etching mask in patterning the semiconductor layer. In the embodiment, the process of patterning the semiconductor layer includes, for example, patterning the channel material layer 132 (see FIG. 2D) to form a channel layer 132a. Wherein, the method for patterning the channel material layer 132 includes, for example, dry etching. In more detail, in the embodiment, a plasma is used to etch the channel material layer 132 for forming the channel layer 132a. It should be noted that during the process for etching the channel material layer 132, since the drain electrode 144 is covered with a mask layer 250a, the drain electrode 144 is not bombarded by the plasma during the etching process.

Figure 2F:
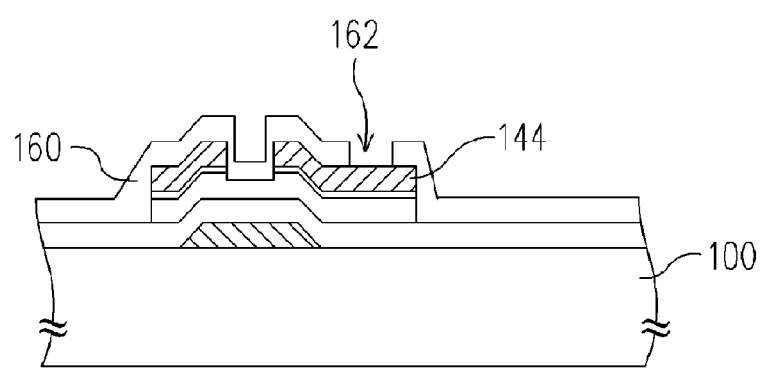

In FIG. 2F, the mask layers 250a, 250b (see FIG. 2E) are removed, and a passivation layer 160 is formed over the substrate 100. Wherein, after forming the passivation layer 160 over the substrate 100, it further includes, for example, forming an opening 162 in the passivation layer 160 to expose the drain electrode 144.

Figure 2G:
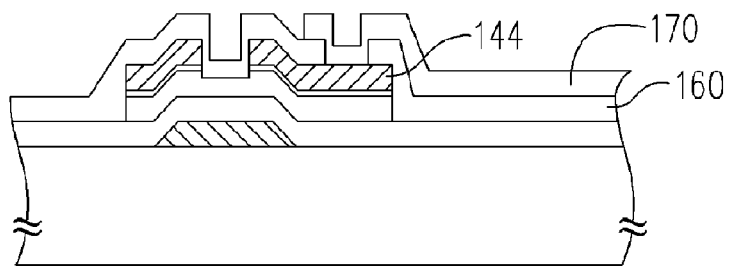

In FIG. 2G, a pixel electrode 170 is formed over a passivation layer 160, the pixel electrode 170 is electrically coupled with the drain electrode 144. In addition, the pixel electrode 170 is electrically coupled with the drain electrode 144 through, for example, the opening 162 (see FIG. 2F). In addition, the method for forming the pixel electrode 170 includes, for example, forming a transparent conductive film (not shown), and performing photolithographic process and etching process, to pattern the transparent conductive film. The transparent conductive film includes, for example, indium tin oxide (ITO) or indium zinc oxide (IZO), in which the IZO is in higher purity but is in higher resistance and more expensive. In addition, the method for forming the transparent conductive film includes, for example, sputtering process.

Second Embodiment

Figure 3A:
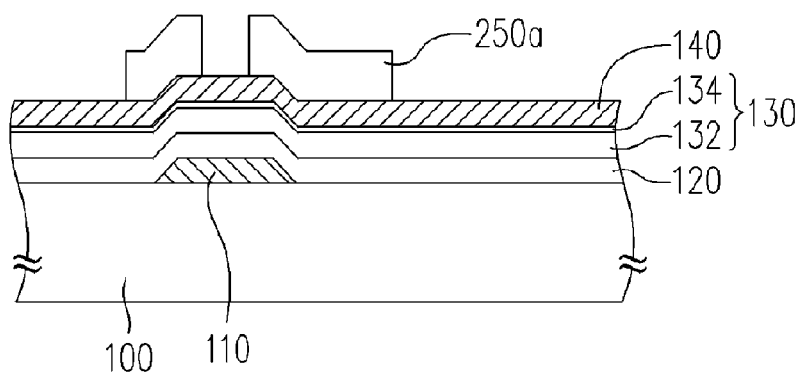
FIGS. 3A–3E are cross-sectional views, schematically illustrating the manufacture process flow for a pixel structure, according to a second embodiment of the invention.

FIGS. 3A–3E are cross-sectional views, schematically illustrating the manufacture process flow for a pixel structure, according to a second embodiment of the invention. In FIGS. 3A–3E, the manufacture method of pixel structure in the second embodiment mainly includes the following steps. In FIG. 3A, using the steps in FIGS. 2A–2C to form a gate electrode 110 over the substrate 100. A gate insulating layer 120 is formed over the substrate 100. And then, a semiconductor layer 130 is formed over the gate insulating layer 120. Wherein, the method for forming the semiconductor layer 130 includes, for example, forming a channel material layer 132 over the gate insulating layer 120, and forming an ohm contact material layer 134 over the channel material layer 132. A metal layer 140 is formed over the semiconductor layer 130, and a mask layer 250a is formed over the metal layer 140.

Figure 3B:
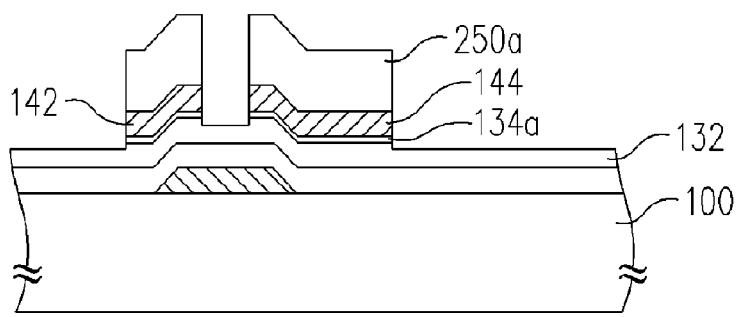

In FIG. 3B, the mask layer 250a is used as the etching mask, so as to pattern the metal layer 140 (see FIG. 3A) to form a source electrode 142 and a drain electrode 144. In addition, in the embodiment, after forming the source electrode 142/drain electrode 144, for example, it further includes patterning the ohm contact material layer 134 (see FIG. 3A), so as to form an ohm contact layer 134a. In addition, the method for patterning the metal layer 140 and the ohm contact material layer 134 is the same as previous descriptions and is not repeated in descriptions.

Figure 3C:
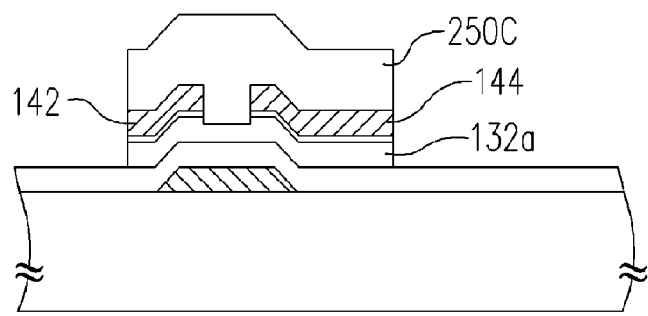

In FIG. 3C, the mask layer 250a (see FIG. 3B) is removed, and another mask layer 250C is formed over the source electrode 142 and drain electrode 144, and the mask layer 250C further covers the region between the source electrode 142 and the drain electrode 144. Wherein the method for forming the mask layer 250C includes forming a photoresist layer and patterning the photoresist layer by photolithographic process. Then, then the mask layer 250C is used as the etching mask for patterning the semiconductor layer. In the embodiment about patterning the semiconductor layer is, for example, patterning the channel material layer 132 (see FIG. 3B) to form a channel layer 132a. It should be noted that the drain electrode 144 is covered by the mask layer 250C, so that the drain region 144 is not bombarded by the plasma during the etching process.

Figure 3D:
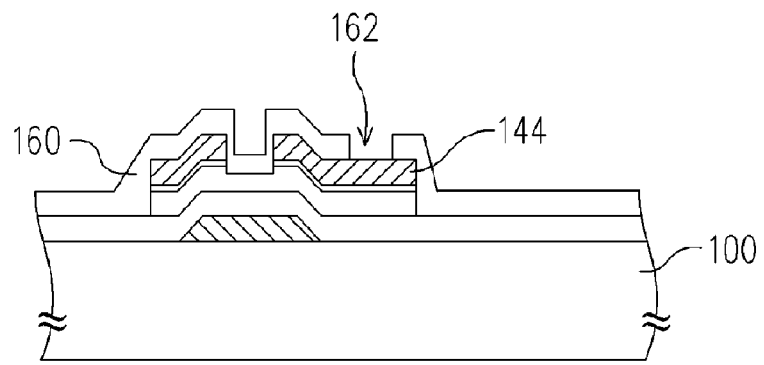

In FIG. 3D, the mask layer 250C (see FIG. 3C) is removed and a passivation layer 160 is formed over the substrate 100. Wherein, after the passivation layer 160 is formed over the substrate 100, for example, an opening 162 is further formed in the passivation layer 160, to expose the drain electrode 144.

Figure 3E:
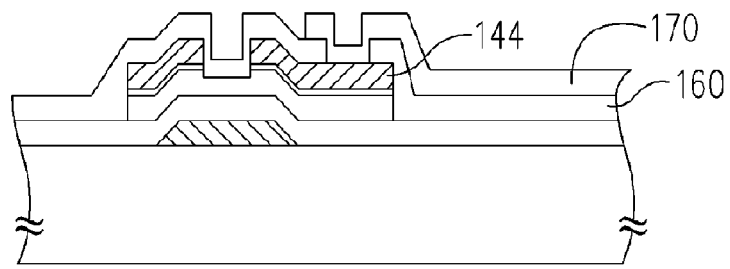

In FIG. 3E, a pixel electrode 170 is formed over the passivation layer 160 and the pixel electrode 170 is electrically coupled to the drain electrode 144. In the embodiment, the pixel electrode 170 is, for example, electrically coupled to the drain electrode 144 through the opening 162 (see FIG. 3D). In addition, the method for forming the pixel electrode is similar to the previous description without repeat.

In summary, in the manufacture method of pixel structure in the first embodiment, since the first mask layer is not removed after patterning the source electrode/drain electrode, and a second mask layer is formed on the first mask layer and covers the region between the source/drain electrodes. As a result, when the dry etching process is performed to pattern the semiconductor layer, the first mask layer and the second mask layer are used as the etching mask, so that the drain electrode is not bombarded by the plasma, and the contact impedance between the drain electrode and the pixel electrode can be reduced. The yield rate can increase, and the displaying quality of the TFT-LCD can increase also. In addition, the manufacture method of pixel structure in the first embodiment removes the first mask layer and the second mask layer at the same time, it can save one-step of removing the mask layer. This can increase the throughput.

Further still, in the manufacture method of pixel structure in the first embodiment, the mask layer is formed over the source electrode/drain electrode, and the mask layer fully covers the source/drain electrodes and the region between the source/drain electrodes. Therefore, when the dry etching process is performed to pattern the semiconductor layer, the drain electrode is not bombarded by the plasma, and the contact impedance between the drain electrode and the pixel electrode can be reduced. The yield rate can increase, and the displaying quality of the TFT-LCD can increase also.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A manufacture method of pixel structure, comprising:
   forming a gate electrode over a substrate;
   forming a gate insulating layer over the substrate, and covering the gate electrode;
   forming a semiconductor layer over the gate insulating layer;

forming a metal layer over the semiconductor layer;
forming a first mask layer over the metal layer;
patterning the metal layer to form source/drain electrodes, using the first mask layer as an etching mask, wherein a portion of the semiconductor in thickness is also removed;
forming a second mask layer over the first mask layer, and the second mask layer further covering a region between the source/drain electrodes;
patterning the semiconductor layer, using the first mask layer and the second mask layer as an etching mask;
removing the first mask layer and the second mask layer;
forming a passivation layer over the substrate; and
forming a pixel electrode over the passivation layer, wherein the pixel electrode is electrically coupled with a drain electrode of the source/drain electrodes.

2. The manufacture method of claim 1, wherein the step of forming the semiconductor layer comprises:
forming a channel material layer; and
forming an ohm contact material layer over the channel material layer.

3. The manufacture method of claim 1, after forming the passivation layer over the substrate, further comprising forming an opening in the passivation layer to expose the drain electrode, and the pixel electrode is electrically coupled with the drain electrode through the opening.

4. The manufacture method of claim 1, wherein the step of forming the first mask layer comprising:
coating a first photoresist layer over the metal layer; and
performing a photolithographic process, to pattern the first photoresist layer.

5. The manufacture method of claim 1, wherein the step of forming the second mask layer comprising:
coating a second photoresist layer over the first mask layer, and the second photoresist layer also covering a region between the source/drain electrodes; and
performing a photolithographic process, to pattern the second photoresist layer.

6. The manufacture method of claim 1, wherein the step of patterning the metal layer to form the source/drain electrodes comprises performing a dry etching process or a wet etching.

7. The manufacture method of claim 1, wherein the step of patterning the semiconductor layer comprises performing a dry etching process.

8. The manufacture method of claim 1, wherein the step of forming pixel electrode comprises:
forming a transparent conductive layer over the passivation layer; and
performing a photolithographic process, to pattern the transparent conductive layer.

9. The manufacture method of claim 8, wherein the step of forming the transparent conductive layer comprises performing a sputtering process.

10. A manufacture method of pixel structure, comprising:
forming a gate electrode over a substrate;
forming a gate insulating layer over the substrate, and covering the gate electrode;
forming a semiconductor layer over the gate insulating layer;
forming a metal layer over the semiconductor layer;
forming a first mask layer over the metal layer;
patterning the metal layer to form source/drain electrodes, using the first mask layer as an etching mask, wherein a portion of the semiconductor layer in thickness is also removed;
removing the first mask layer;
forming a second mask layer over the source/drain electrodes, and the second mask layer also covering a region between the source/drain electrodes;
patterning the semiconductor layer, using the second mask layer as an etching mask;
removing the second mask layer;
forming a passivation layer over the substrate; and
forming a pixel electrode over the passivation layer, wherein the pixel electrode is electrically coupled with a drain electrode of the source/drain electrodes.

11. The manufacture method of claim 10, wherein the step of forming the semiconductor layer comprises:
forming a channel material layer; and
forming an ohm contact material layer over the channel material layer.

12. The manufacture method of claim 10, after forming the passivation layer over the substrate, further comprising forming an opening in the passivation layer to expose the drain electrode, and the pixel electrode is electrically coupled with the drain electrode through the opening.

13. The manufacture method of claim 10, wherein the step of forming the first mask layer comprising:
coating a first photoresist layer over the metal layer; and
performing a photolithographic process, to pattern the first photoresist layer.

14. The manufacture method of claim 10, wherein the step of forming the second mask layer comprising:
coating a second photoresist layer over the source/drain electrodes, and covering a region between the source/drain electrodes; and
performing a photolithographic process, to pattern the second photoresist layer.

15. The manufacture method of claim 10, wherein the step of patterning the metal layer to form the source/drain electrodes comprises performing a dry etching process or a wet etching process.

16. The manufacture method of claim 10, wherein the step of patterning the semiconductor layer comprises performing a dry etching process.

17. The manufacture method of claim 10, wherein the step of forming pixel electrode comprises:
forming a transparent conductive layer over the passivation layer; and
performing a photolithographic process, to pattern the transparent conductive layer.

18. The manufacture method of claim 17, wherein the step of forming the transparent conductive layer comprises performing a sputtering process.

* * * * *